(12) United States Patent
Inoue et al.

(10) Patent No.: US 6,971,113 B2
(45) Date of Patent: Nov. 29, 2005

(54) ATTACHING AND DETACHING MECHANISM

(75) Inventors: Katsuyuki Inoue, Kanagawa (JP); Shigeo Hiramoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/119,011

(22) Filed: Apr. 29, 2005

(65) Prior Publication Data

US 2005/0204375 A1 Sep. 15, 2005

Related U.S. Application Data

(63) Continuation of application No. 10/275,358, filed as application No. PCT/JP02/02274 on Mar. 12, 2002, now Pat. No. 6,904,606.

(30) Foreign Application Priority Data

Mar. 14, 2001 (JP) ............................. 2001-071354

(51) Int. Cl.$^7$ .............................................. G11B 33/02
(52) U.S. Cl. ..................................................... 720/646
(58) Field of Search ................................. 720/646, 647

(56) References Cited

U.S. PATENT DOCUMENTS 5,245,511 A * 9/1993 Watanabe ..................... 361/814
5,967,570 A * 10/1999 Lee ............................... 292/31

* cited by examiner

Primary Examiner—David Davis
(74) Attorney, Agent, or Firm—Jay H. Maioli

(57) ABSTRACT

Coupling between a unit main body and a front panel is detachably carried out by catching means and coupling means. The coupling means comprise slide means 33 provided with a slide plate 24 which slides with respect to a bracket hardware 24 embedded in the unit main body, and holding means 28 provided at a front face of the slide plate 24 and for holding the front panel.

1 Claim, 10 Drawing Sheets

PRIOR ART
FIG.13A
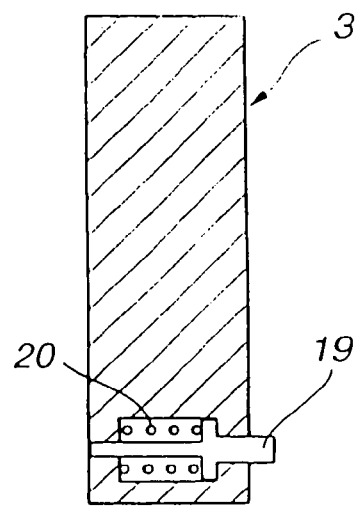
FIG.13B
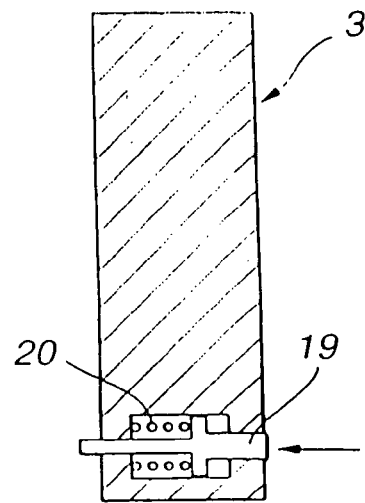
FIG.14                    PRIOR ART
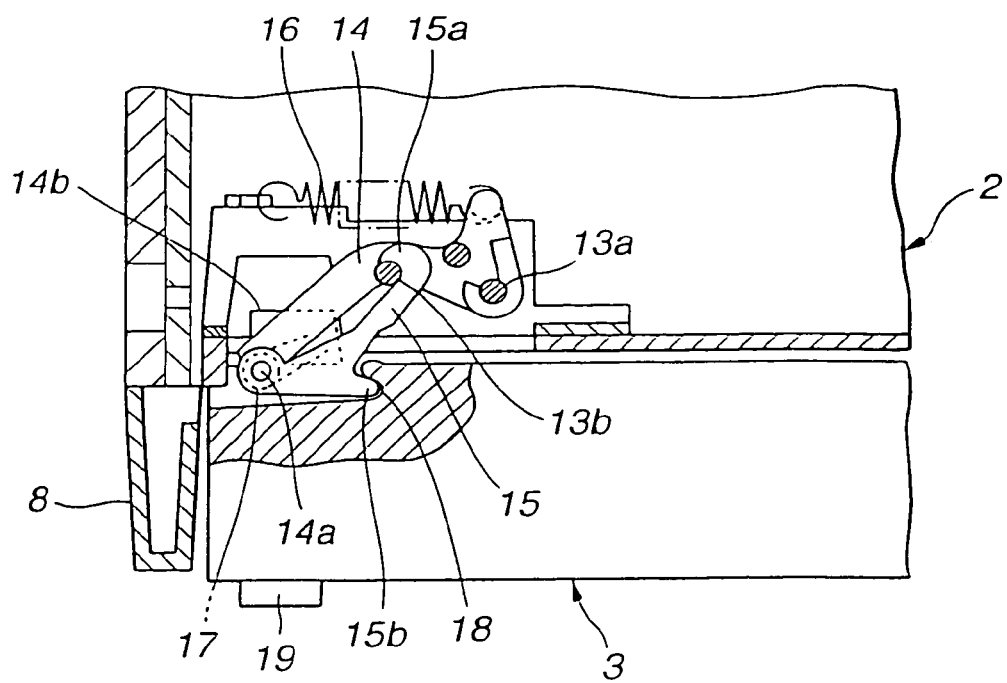

ATTACHING AND DETACHING MECHANISM

This is a continuation of prior application Ser. No. 10/275,358 filed Nov. 5, 2002, now U.S. Pat. No. 6,904,606, which is a 371 of PCT/JP02/02274, filed Mar. 12, 2002.

TECHNICAL FIELD

The present invention relates to attaching and detaching mechanisms suitable for application to vehicle-mounted audio units.

BACKGROUND ART

In recent years, in audio units such as cassette player, CD (Compact Disc) player or DVDs (Digital Versatile Disc), which are recording and/or reproducing devices, various units of vehicle-mounted specifications come into wide use. In such vehicle-mounted units, there arises a problem that the unit may be stolen while a driver is away from his/her vehicle.

For this reason, the countermeasures are taken such that the audio unit is constructed to have a unit main body and an operating part divided, for example, wherein the operating part is detachable with respect to the unit main body. When leaving the vehicle, the driver detaches the operating part from the unit main body to carry it with him/her. Since the unit main body cannot operate without operating part, there is no possibility of theft of the unit main body.

With the vehicle-mounted audio unit having an operating part detachable as described above, a conventional example of a mechanism for attaching and detaching the operating part to and from the unit main body is described in Japanese Patent JP-A 7-156719, which is constructed as follows:

As shown in FIGS. 10, 11, and 12, an audio unit 1 comprises a unit main body 2 and a front panel 3 as an operating part. The front panel 3 is provided with operating buttons 4 and a display 5, and is formed with a cassette opening 6*b* corresponding to a cassette loading mouth 6*a* of the unit main body 2. Moreover, connection terminals 7*a*, 7*b* are arranged for electrical connection upon mounting of the front panel 3.

Next, the structure for attaching and detaching the front panel 3 will be described. The unit main body 2 is formed with blind plate 8 for receiving the front panel 3 and a frame 8*a* at the periphery of the blind plate 8. There are arranged catching means 9 for catching one side or the right side of the front panel 3 and coupling means 10 for coupling another side or the left side of the front panel 3.

The catching means 9 comprise a pair of protrusions 11 formed on the frame 8 and a pair of engaging portions 12 formed with the front panel 3. The coupling means 10 comprise a mounting support plate 13, an arm 14, a holder 15, an extension coil spring 16 and a spring 17 normally elastically biased in the direction of center X as shown in FIG. 12, and an engaging recess 18 as shown in FIG. 11.

FIG. 14 shows the state of the front panel 3 attached. Since the arm 14 having a pin 14*a* and a release operating part 14*b* integrated therewith and formed out of synthetic resin is rotatable about pins 13*a*, and the spring 16 is greater in biasing force than the spring 17, the engagement is maintained between engaging portions 15*a* of the holder 15 mounted to the arm 14 to be rotatable about the pin 14*a* and pins 13*b*. Thus, an engaging portion 15*b* is engaged with the engaging recess 18, holding the attached state of the front panel 3.

When detaching the front panel 3, a release button 19 is pushed. Then, the release button 19 is protruded from the back of the front panel 3 (state in FIG. 13B) against a biasing force of a spring 20 to push the release operating part 14*b*. Then, the arm 14 is pushed backward against a biasing force of the spring 16 as shown in FIG. 15, in accordance with which the engaging portions 15*a* are disengaged from the pins 13*b* by a biasing force of the spring 17. The front panel 3 is pushed forward by a biasing force of the spring 17. Then, as shown in FIG. 16, the front panel 3 is pushed further forward by the action of the spring 17.

In the state in FIG. 16, the engaging portion 15*b* is engaged with the engaging recess 18, holding the attached state of the front panel 3. In this state, when taking the front panel 3 by hand and disengaging the engaging portion 15*b* from the engaging recess 18, the front panel 3 can completely be detached from the unit main body 2.

Next, when attaching the front panel 3, the pair of engaging portions 12 is engaged with the pair of protrusions 11 in FIG. 11, and then the left side of the front panel 3 is pushed in. Then, the engaging portion 15*b* is engaged with the engaging recess 18, attaching the front panel 3 to the unit main body 1 as shown in FIG. 14.

However, as seen from FIG. 14, since the coupling of the coupling means 10 is carried out by engaging the engaging portion 15*b* with the engaging recess 18, a large play between the two may cause falling out of the front panel 3 due to easy disengagement, while a small play may cause breakage of the engaging portion 15*b* and the engaging recess 18. Thus, fine combination verification is needed every time a metal mold of the front panel 3 is formed, leading to complicated and troublesome work.

Therefore, the present invention aims to provide attaching and detaching mechanisms which are free from such problem.

DISCLOSURE OF THE INVENTION

The invention in claim 1 provides an attaching and detaching mechanism wherein in order to attach and detach an operating part to and from a unit main body, the mechanism is provided with coupling means for detachably coupling another side of the operating part with one side of the operating part caught through catching means, characterized in that said coupling means comprise slide means having a slide member provided to said unit main body and for sliding to and fro, and holding means provided at a front end of said slide member and for holding said operating part.

The invention in claim 2 is such that said slide means comprise first biasing means for biasing said slide member forward, lock means for restraining said slide means in the backward moved state against a biasing force of said first biasing means, and release means for releasing lock by said lock means.

The invention in claim 3 is such that said holding means comprise a pair of claws provided at the front end of said slide member and for carrying out holding, and a held part formed with said operating part and held by the pair of claws.

The invention in claim 4 is such that at least one of said pair of claws is always biased in the direction of holding the held part.

The invention in claim 5 is such that at least one of said pair of claws includes a rotatable and movable claw, and second biasing means are arranged for biasing the movable claws in the direction of holding said held part.

The invention in claim 6 is such that both of said pair of claws include a rotatable and movable claw, and second biasing means are arranged for biasing the respective movable claws in the direction of holding said held part.

The invention in claim 7 is such that both of said pair of claws are formed out of an elastically deformable material to open in flexible deformation of the respective claws.

BRIEF DESCRIPTION OF THE DRAWINGS

FIG. 4 are associated with the embodiment 1 of an attaching and detaching mechanism, with the front panel attached, according to the present invention, wherein

FIG. 7 are associated with the coupling means in an embodiment 2 of an audio unit using an attaching and detaching mechanism according to the present invention, wherein

FIG. 13 are explanatory views for a release button of the audio unit using conventional attaching and detaching mechanism;

FIG. 14 is an operation explanatory view for the audio unit using conventional attaching and detaching mechanism when attaching the front panel;

BEST MODE FOR CARRYING OUT THE INVENTION

A description is made hereafter about embodiments of an attaching and detaching mechanism according to the present invention applied to an audio unit.

a) Embodiment 1

Figure 1:
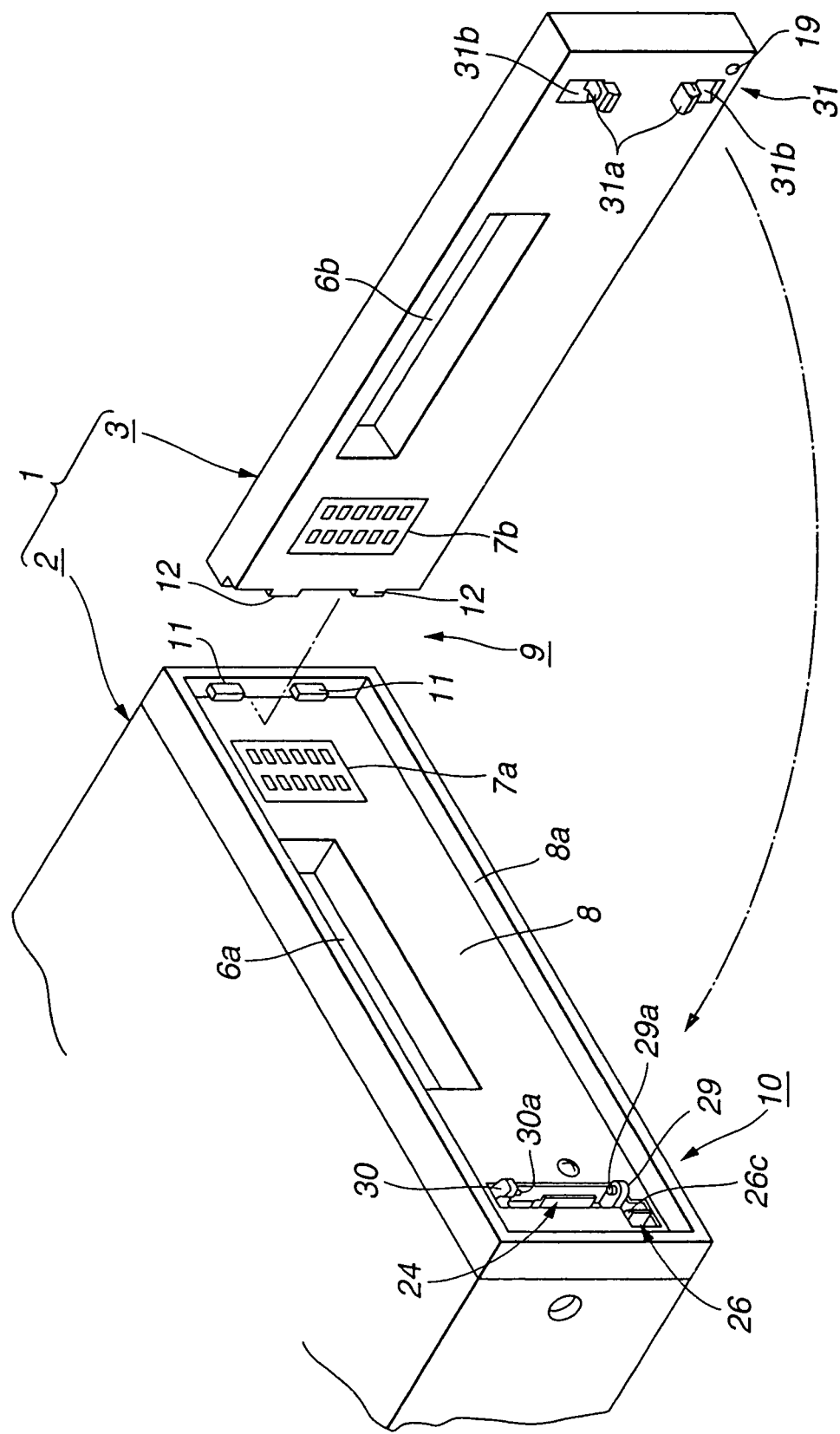
FIG. 1 is a perspective view of an embodiment 1 of an audio unit with a front panel removed, using an attaching and detaching mechanism according to the present invention.

First, the embodiment 1 is described with reference to FIG. 1. Since the present invention is involved with modification of the coupling means 10 only out of the catching means 9 and the coupling means 10 for detachably coupling the unit main body 2 and the front panel 3 of the conventional audio unit, only the coupling means 10 is described.

Figure 2:
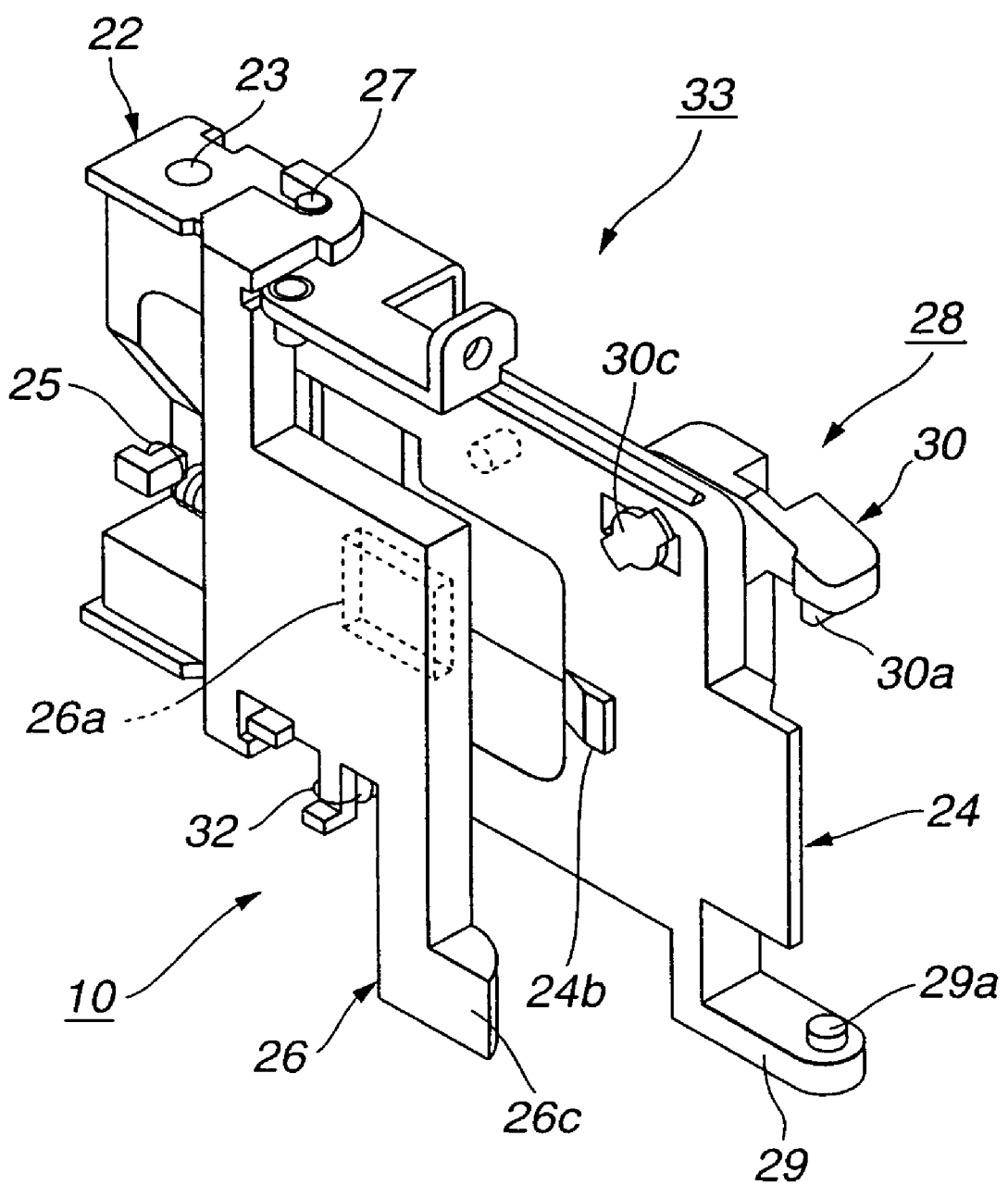
FIG. 2 is a perspective view of coupling means in the embodiment 1 of an audio unit using an attaching and detaching mechanism according to the present invention.
Figure 3:
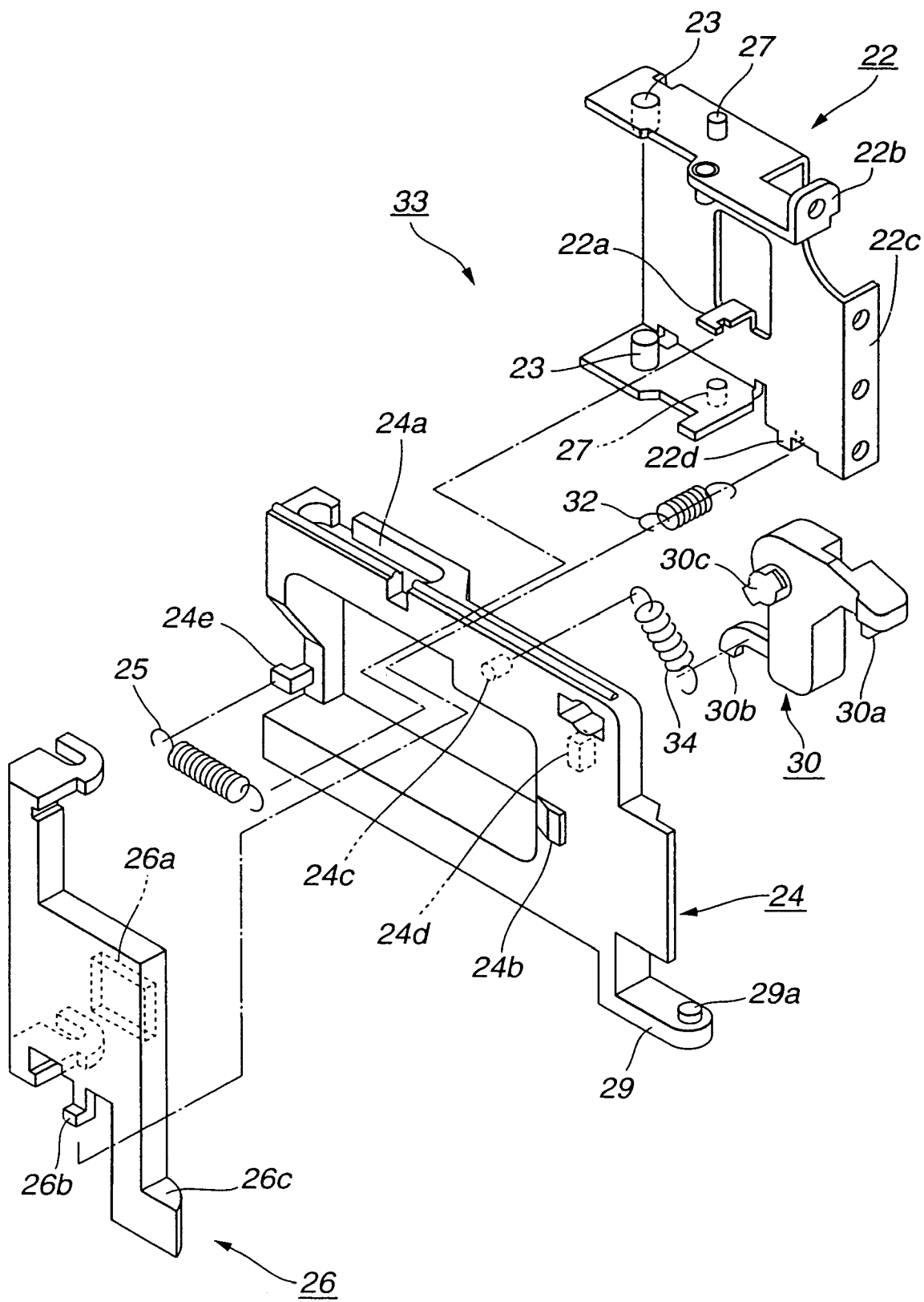
FIG. 3 is an exploded perspective view of the embodiment 1 of an attaching and detaching mechanism according to the present invention.

As shown in FIG. 2, the coupling means 10 comprise slide means 33 and holding means 28. The slide means 33 are constructed as follows. As shown in FIG. 3, a bracket hardware 22 having a C-shaped section is mounted inside the blind plate 8 of the unit main body 1 through mounting parts 22b, 22c. A pair of pins 23 is arranged to protrude from the facing sides of upper and lower side plates. The pair of pins 23 is engaged with a pair of grooves 24a formed in a slide plate (slide member) 24 made of resin. The slide plate 24 is slidable to and fro with respect to the bracket hardware. A spring (first biasing means) 25 is arranged between spring hooks 22a, 24e to bias the slide plate 24 forward. Moreover, a lock lever (lock means) 26 is arranged to lock the slide plate 24 in the backward pressed state against a biasing force of the spring 25. The lock lever 26 is rotatably arranged through a pair of pins 27 protruding from the upper and lower side plates of the bracket hardware 22 in the opposite directions. The lock lever 26 has a lock recess 26a formed in the side facing the slide plate 24 at the position away from an axis of rotation connecting the pair of pins 27, whereas the slide plate 24 has a protrusion 24b formed at the position facing the lock recess 26a. An extension spring 32 is arranged between spring hooks 26b, 22d to bias the lock recess 26a toward the protrusion 24b.

Holding means 28 are arranged at a front end of the slide plate 24. The holding means 28 comprise a stationary claw and a movable claw. There is arranged L-shaped stationary claw 29 which is integrated with a lower portion of the slide plate 24 and has a convex 29a formed at the tip to extend upward. There is arranged movable claw 30 in an upper portion of the slide plate 24. The movable claw 30 is rotatably mounted to the slide plate 24 through a rotation shaft 30c integrated with the movable claw 30 and is biased in the holding direction through an extension coil spring (second biasing means) 34 arranged between spring hooks 30b, 24c. A stopper 24d is integrally formed with the slide plate 24 to stop the movable claw 30 in the most closed state. A convex 30a is formed also on the underside of the movable claw 30. In order that when pushing the front panel 3 toward the holding means 28, the movable claw 30 may be lifted about the rotation shaft 30c against a resilient force of the spring 34, a taper face 30d is formed on a front face of the convex 30a.

Figure 4A:
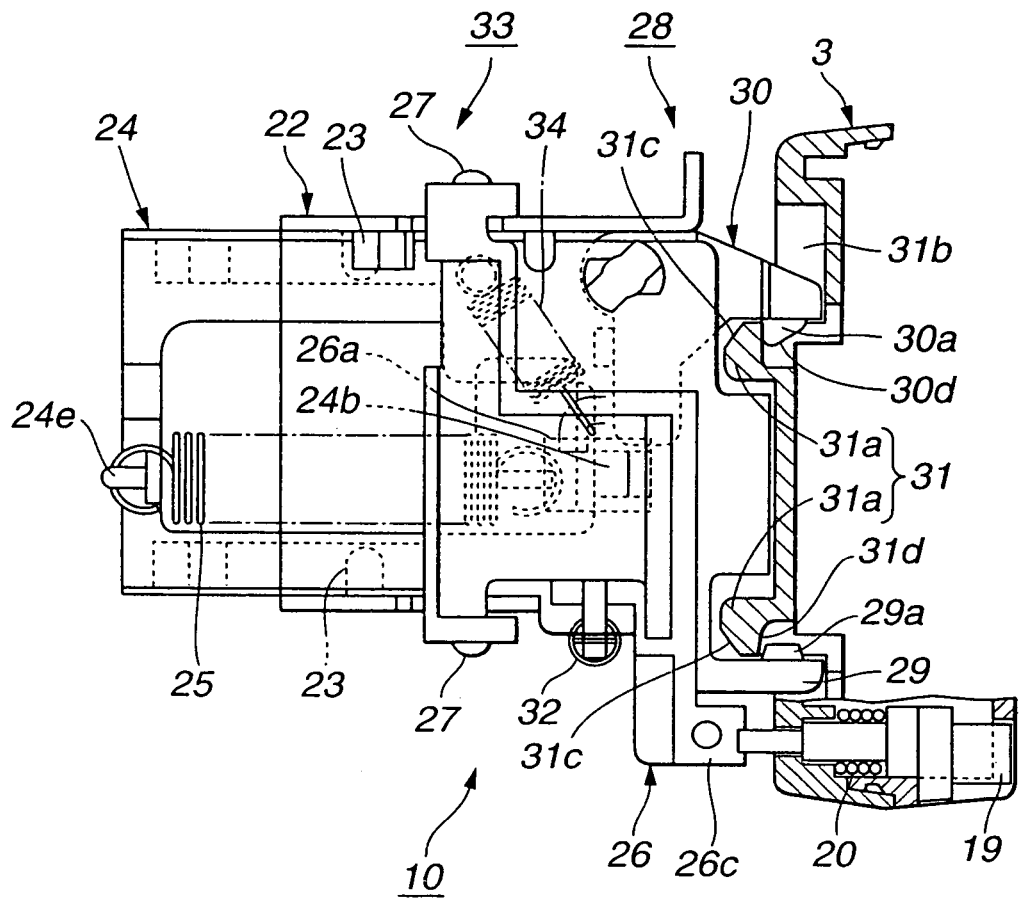
FIG. 4A is a front view.

On the other hand, a held part 31 to be held by the holding means 28 is formed on the back of the front panel 3. The structure of the held part 31 is described below. As shown in FIG. 4A, the held part 31 is formed by a pair of roughly L-shaped protrusions 31a protruding backward from the front panel 3, and has recesses 31b formed above and below the upper and lower protrusions 31a to facilitate claw holding. Taper faces 31c, 31c are formed on the back of the upper and lower protrusions 31a to open the distance between the stationary claw 29 and the movable claw 30 for holding when pushing the front panel 3 backward. On the other hand, a taper face 31d is formed on the front of the lower protrusion 31a to disengage the held part 31 held by the holding means 28 when slightly applying a force.

Figure 4B:
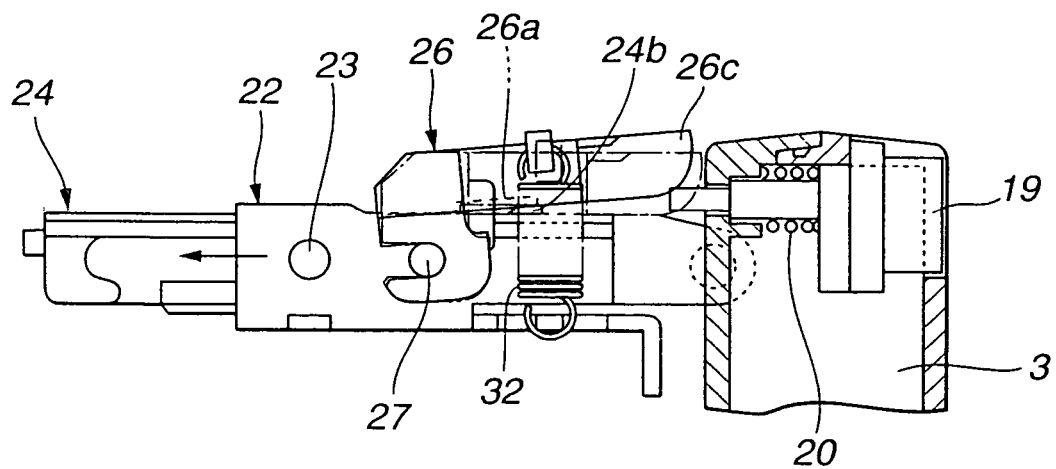
FIG. 4B is a bottom view.

As shown in FIGS. 4A–4B, in the present invention as well, there are arranged the same release button (release means) 19 and spring 20 as the conventional ones. By pushing the tip of the release button 19 backward, the lock lever 26 is slightly rotated about the pin 23 against a biasing force of the spring 32. Specifically, a circular part 26c is integrally formed with the lock lever 26 to release a restraint of the slide plate 24 by disengaging the lock recess 26a from the protrusion 24b by rotation of the lock lever 26.

Figure 5:
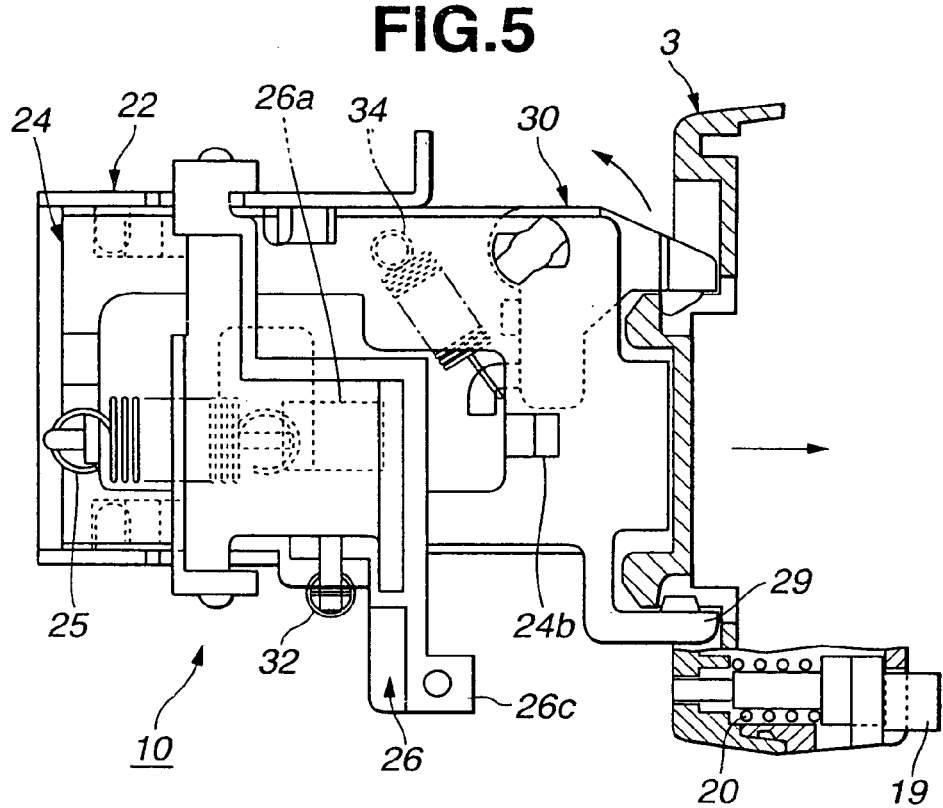
FIG. 5 is a front view showing the embodiment 1 of an attaching and detaching mechanism, with another end of the front panel drawn out, according to the present invention.

Next, operation of such attaching and detaching mechanism is described. When pushing the release button 19 with the front panel 3 attached, the release button 19 is pressed backward against a basing force of the spring 20, thus pressing the circular part 26c (state in FIG. 4B). This causes slight rotation of the lock lever 26 to release the engagement of the lock recess 26a of the lock lever 26 with the protrusion 24b. And the slide plate 24 is slid forward by a biasing force of the spring 25. As a result, as shown in FIG. 5, another end of the front panel 3 is pushed out, and the front panel 3 is slightly rotated about one end thereof.

Figure 6:
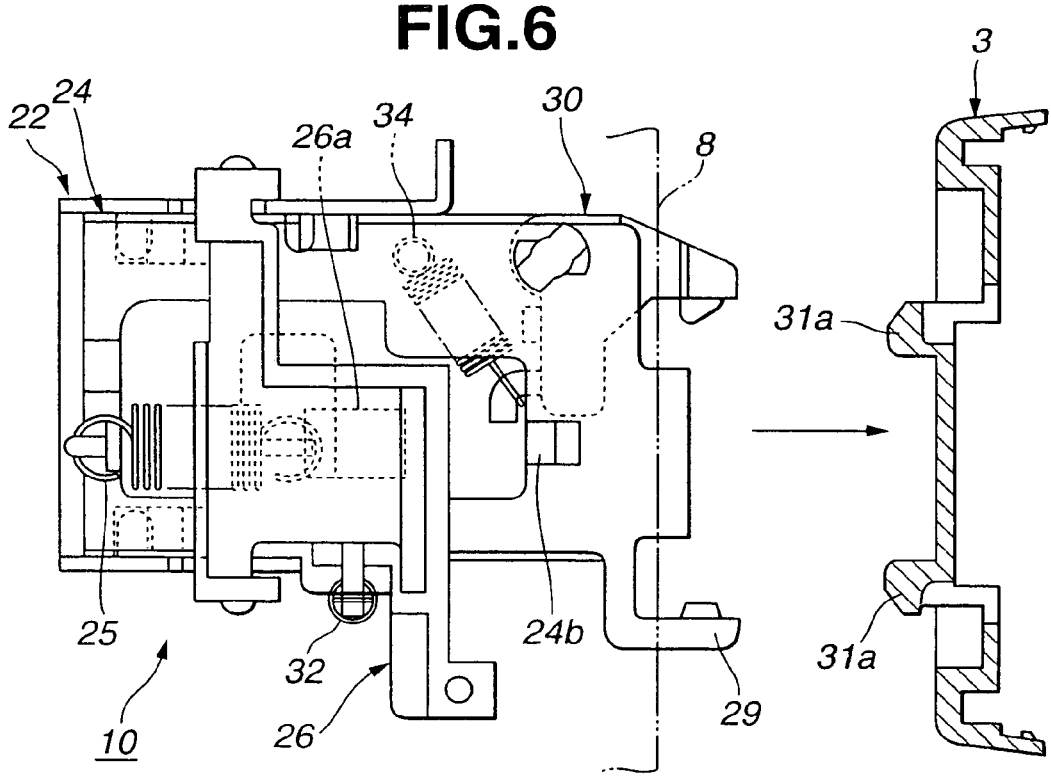
FIG. 6 is a front view showing the embodiment 1 of an attaching and detaching mechanism, with another end of the front panel removed from a pair of claws by drawing out it, according to the present invention.

In this state, when grasping and drawing out another end of the front panel 3, small torque is applied to the movable claw 30, which is rotated in the open direction against a biasing force of the spring 34. With this, as shown in FIG. 6, the front panel 3 can be disengaged from the movable claw 30. And by disengaging the catching means 9, the whole of the front panel 3 can be removed.

Next, when attaching the front panel 3 to the unit main body 2, one ends of the front panel 3 and the unit main body 2 are engaged with each other, i.e. the catching means 9 are engaged, and another end of the front panel 3 is pushed toward the unit main body 2. Then, due to interaction between the upper and lower taper faces 31c, 31c on the back of the held part 31 of the front panel 3 and the taper face 30b of the movable claw 30, a force operates on the movable claw 30 to open it, while a force operates on the slide plate 24 to push it backward.

Here, the spring constant of the spring 34 is smaller than that of the spring 25, so that with the movable claw 30 opened, the movable claw 30 and the stationary claw 29 pass the pair of protrusions 31a, and then the movable claw 30 is closed to allow the holding means 28 to hold the held part 31. Subsequently, the slide plate 24 is moved backward against a biasing force of the spring 25 for displacement up to the position where secure attachment of the front panel 3 is achieved. At that point, the lock lever 26 is rotated by a biasing force of the spring 32 to allow a restraint of displacement of the protrusion 24b through the lock recess 26a, obtaining locking of the slide plate 24 with the spring 25 being in the loaded state.

It is noted that the upper claw may be a stationary claw, and the lower claw may be a movable claw.

b) Embodiment 2

Figure 7A:
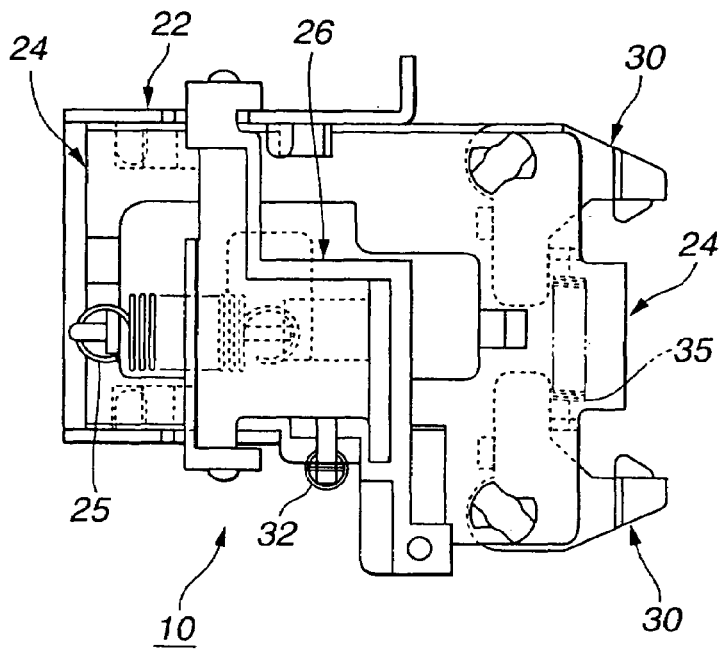
FIG. 7A is a front view.
Figure 7B:
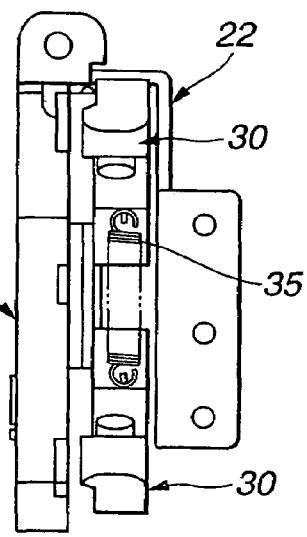
FIG. 7B is a right side view.

Next, the embodiment 2 is shown in FIGS. 7A–7B, wherein only the holding means in the embodiment 1 are modified. Specifically, the lower claw has the same structure as the upper movable claw in place of the stationary claw, and a single extension coil spring 35 is arranged to bias a pair of movable claws 30 in the holding direction.

In such attaching and detaching mechanism, since both claws are rotated, holding and releasing of the held part by the holding means are carried out with light and soft touch.

The other structures and operation are the same as those of the embodiment 1, so that a description thereof is omitted.

c) Embodiment 3

Figure 8A:
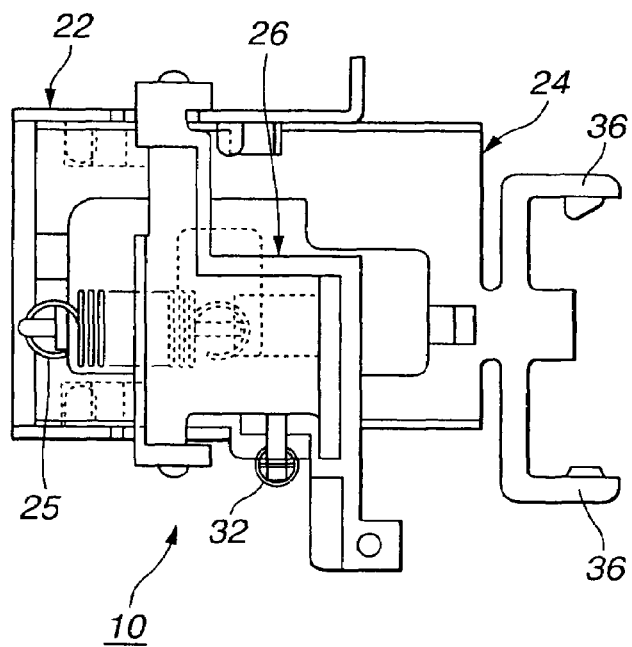
FIG. 8 are associated with the coupling means in an embodiment 3 of an audio unit using an attaching and detaching mechanism according to the present invention, wherein 8A is a front view.
FIG. 8B is a right side view.
Figure 8B:
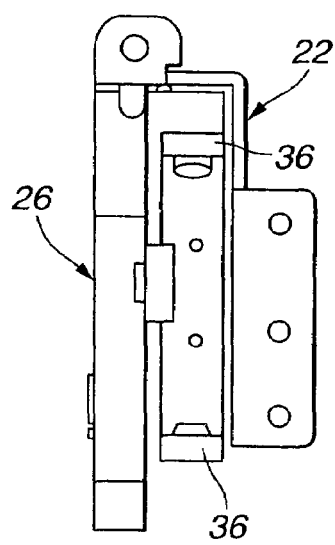

Next, the embodiment 3 is shown in FIGS. 8A–8B. In the embodiment 3, the spring provides a biasing force to a pair of movable claws, whereas in this embodiment, a pair of stationary claws 36 is integrally formed with the slide plate 24, and those are integrally made of resin such as epoxy, polycarbonate or the like. Since a resilient force of resin is available in place of a biasing force of the spring, the cross-sectional area of the pair of claws 36 is set at a small value to provide excellent flexibility.

Operation of such attaching and detaching mechanism is similar to that in the embodiment 2.

The other structures and operation are the same as those of the embodiment 1, so that a description thereof is omitted.

d) Embodiment 4

Figure 9A:
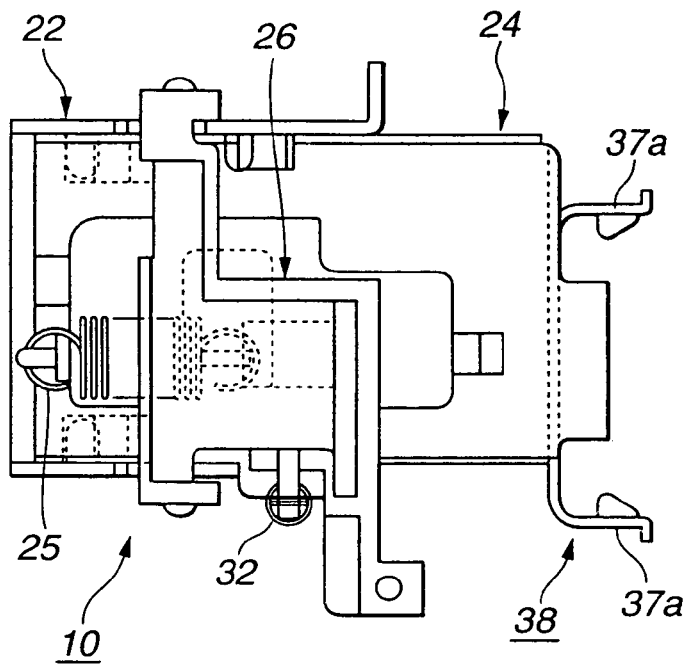
FIG. 9 are associated with the coupling means in an embodiment 4 of an audio unit using an attaching and detaching mechanism according to the present invention, wherein 9A is a front view.
FIG. 9B is a right side view.
Figure 9B:
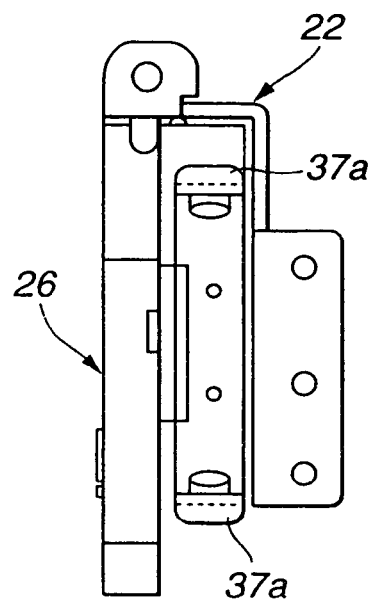
Figure 10:
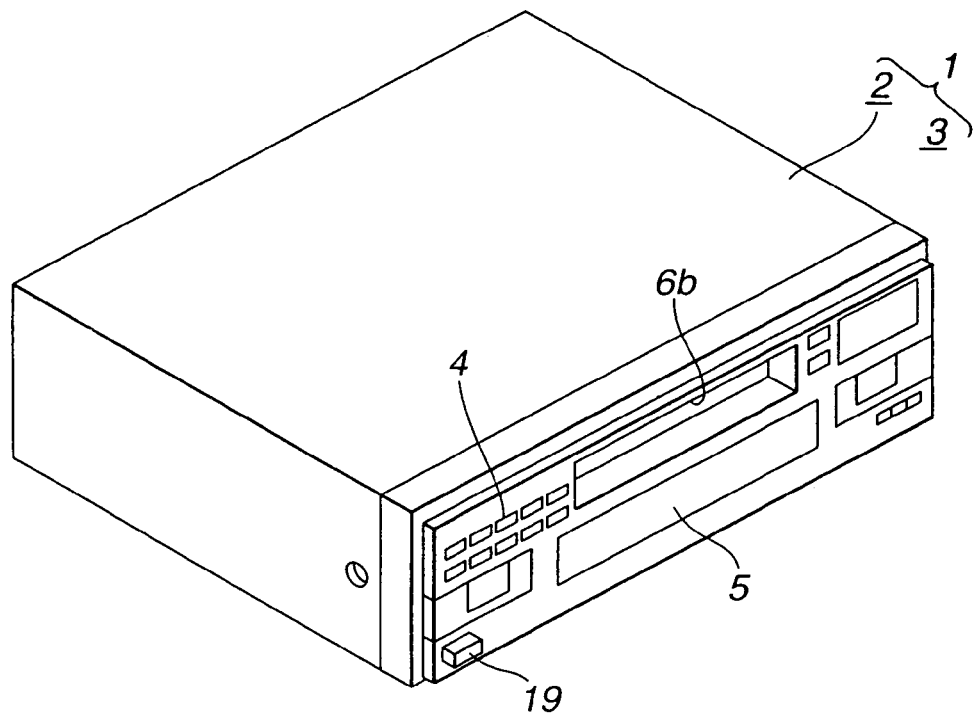
FIG. 10 is a perspective view of an audio unit using a conventional attaching and detaching mechanism.
Figure 11:
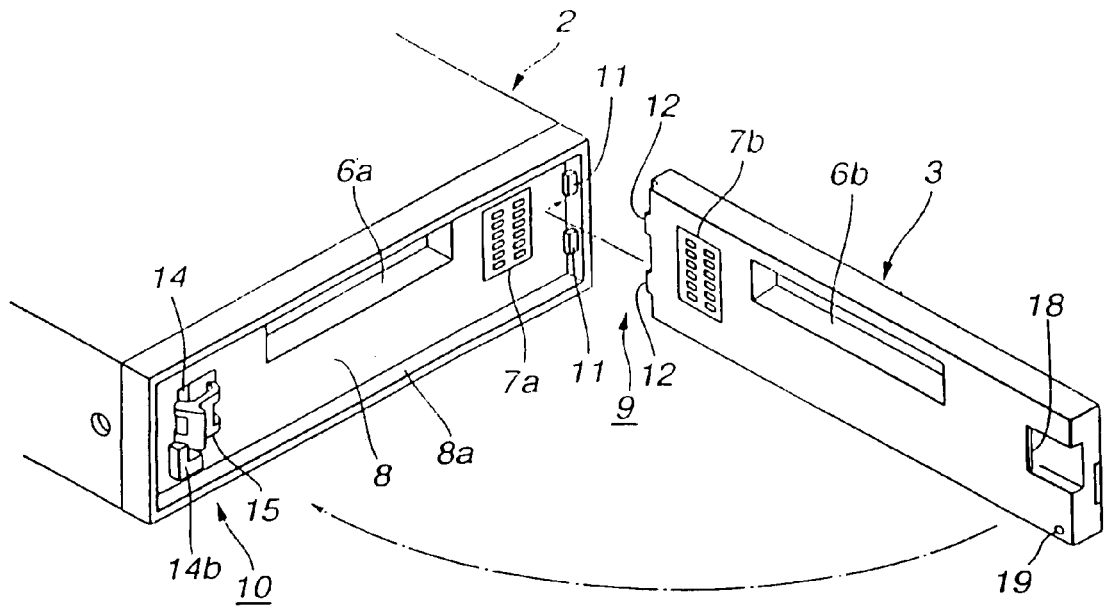
FIG. 11 is a perspective view of the audio unit using conventional attaching and detaching mechanism with the front panel opened.
Figure 12:
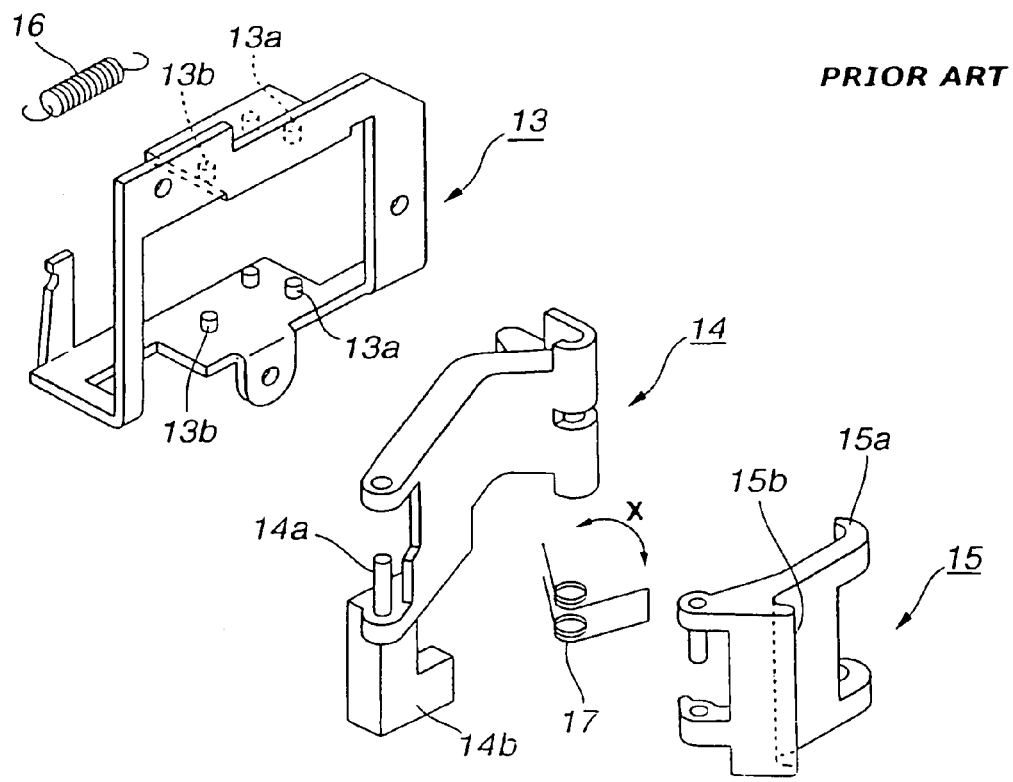
FIG. 12 is an exploded perspective view of the coupling means of the audio unit using conventional attaching and detaching mechanism.
Figure 15:
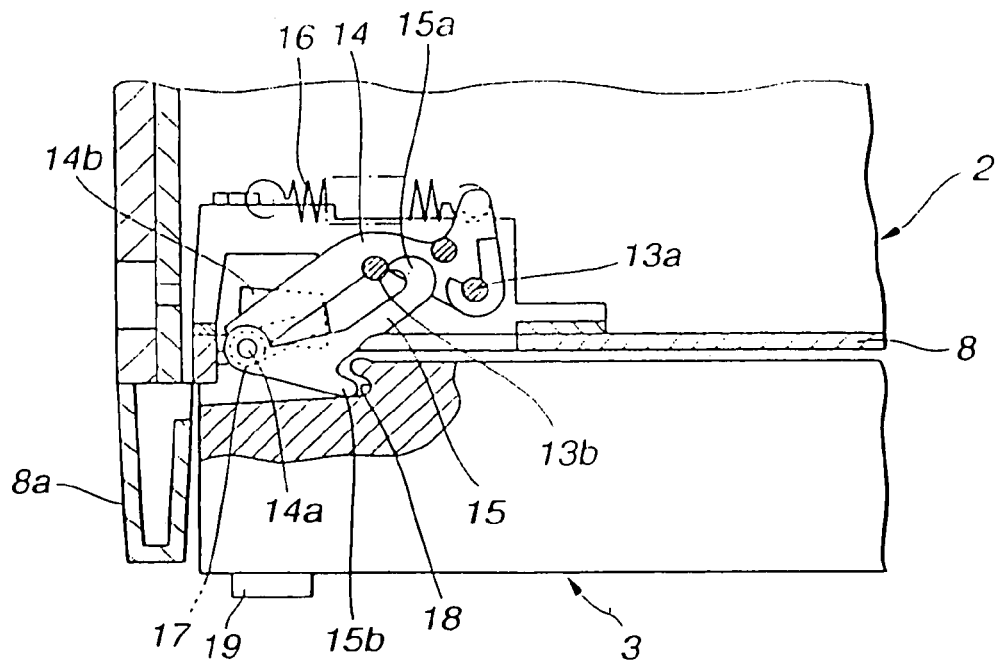
FIG. 15 is an operation explanatory view for the audio unit using conventional attaching and detaching mechanism when pushing the release button.
Figure 16:
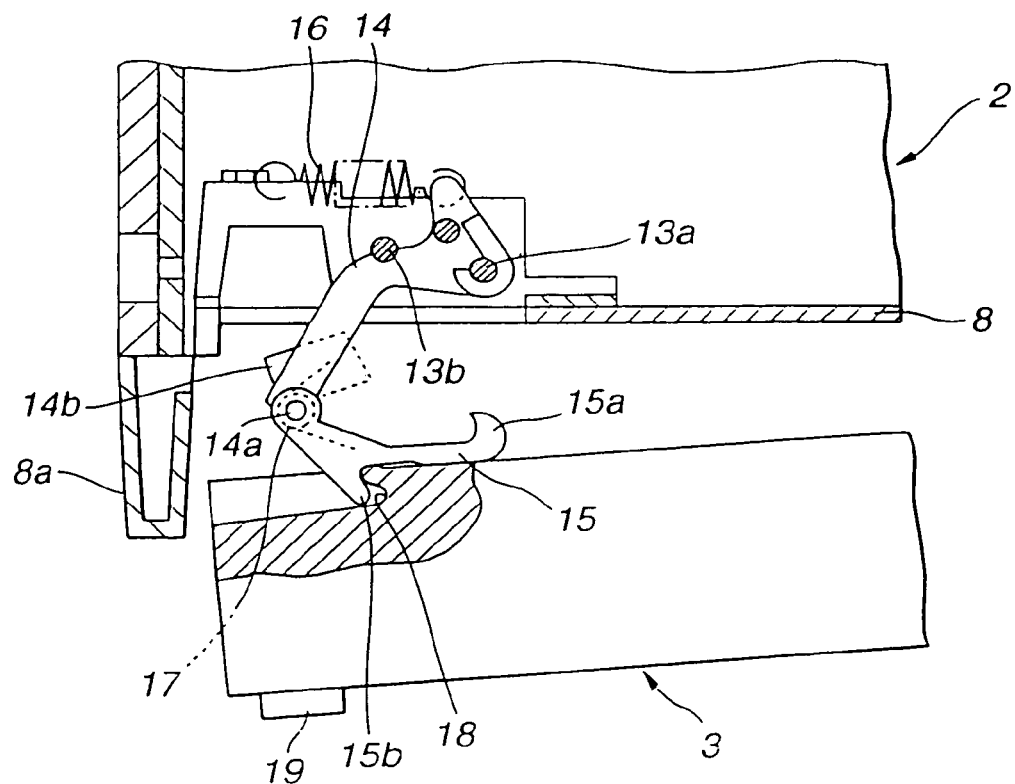
FIG. 16 is an operation explanatory view for the audio unit using conventional attaching and detaching mechanism when opening another end of the front panel.

Finally, the embodiment 4 is shown in FIGS. 9A–9B, which is similar to the embodiment 3 in that a pair of claws is closed by the action of a resilient force, but wherein an U-shaped single claw unit 38 comprising a pair of stationary claws 37a formed out of a single plate made of metal with excellent resilient force such as stainless steel, phosphor bronze or the like is mounted to the slide plate 24 by means of screws, not shown, or welding of resin. A returning force of the metal plate when being bent operates as a holding force, producing the same operation as in the embodiment 3.

The other structures and operation are the same as those of the embodiment 1, so that a description thereof is omitted.

In the embodiments 14, the attaching and detaching mechanism is applied to vehicle-mounted audio units, alternatively, it can be applied to household audio units or television sets.

INDUSTRIAL APPLICABILITY

As is seen from the above description, the attaching and detaching mechanism according to the present invention is useful for vehicle-mounted and household audio units, television sets, etc., particularly, it is suitable when small size and holding and releasing with excellent feel are required

What is claimed is:
1. An attaching and detaching mechanism for attaching and detaching an operating part to and from a unit main body, the mechanism comprising:
   catching means; and
   coupling means for detachably coupling one side of said operating part with another side of the said operating part caught by said catching means, wherein
   said coupling means includes slide means having a slide member provided in said unit main body for sliding in and out of said main body, and holding means provided at a front end of said slide member for holding said operating part, and
   said slide means further comprising first biasing means for biasing said slide member in a forward direction, lock means for restraining said slide means in a backward-moved state against a biasing force of said first biasing means, and release means for releasing a lock state of said lock means, and when said release means releases said lock state of said lock means, said slide member slides in said forward direction pushing out said operating part, wherein said holding means comprise a pair of claws provided at a front end of said slide member for carrying out holding of a held part formed with said operating part, wherein said pair of claws comprise an L-shaped stationary claw at a lower portion of said holding means and a movable claw at an upper portion of said holding means, and wherein said movable claw includes a rotation shaft fitted into an aperture in said slide member and having shoulders to prevent said rotation shaft from sliding out of the aperture, whereby said movable claw is mounted for rotation.

* * * * *

UNITED STATES PATENT AND TRADEMARK OFFICE
CERTIFICATE OF CORRECTION

PATENT NO. : 6,971,113 B2
DATED : November 29, 2005
INVENTOR(S) : Katsuyuki Inoue and Shigeo Hiramoto It is certified that error appears in the above-identified patent and that said Letters Patent is hereby corrected as shown below:

<u>Title page,</u>
Item [*] Notice, insert -- This patent is subject to a terminal Disclaimer. --.

Signed and Sealed this

Twenty-third Day of May, 2006

JON W. DUDAS
*Director of the United States Patent and Trademark Office*